United States Patent
Di Stefano et al.

(10) Patent No.: US 7,562,617 B2
(45) Date of Patent: Jul. 21, 2009

(54) MOUNTING APPARATUS

(75) Inventors: Peter T. Di Stefano, San Jose, CA (US); Thomas H. Di Stefano, Monte Sereno, CA (US)

(73) Assignee: Centipede Systems, Inc., San Jose, CA (US)

( * ) Notice: Subject to any disclaimer, the term of this patent is extended or adjusted under 35 U.S.C. 154(b) by 339 days.

(21) Appl. No.: 11/527,886

(22) Filed: Sep. 27, 2006

(65) Prior Publication Data

US 2007/0273398 A1 Nov. 29, 2007

Related U.S. Application Data

(60) Provisional application No. 60/800,830, filed on May 15, 2006.

(51) Int. Cl.
*F01B 19/02* (2006.01)
(52) U.S. Cl. ............................. 92/97; 92/91; 92/98 R
(58) Field of Classification Search ............... 92/91, 92/93, 96, 97, 98 R, 103 F
See application file for complete search history.

(56) References Cited

U.S. PATENT DOCUMENTS

| | | | |
|---|---|---|---|
| 4,820,976 A | 4/1989 | Brown | 324/760 |
| 4,968,931 A | 11/1990 | Littlebury et al. | 324/760 |
| 5,074,757 A * | 12/1991 | Horn | 92/103 SD |
| 5,148,103 A | 9/1992 | Pasiecznik, Jr. | 324/758 |
| 5,153,504 A | 10/1992 | Bonnet et al. | 324/754 |
| 5,220,277 A | 6/1993 | Reitinger | 324/754 |
| 5,252,916 A | 10/1993 | Swart | 324/757 |
| 5,336,922 A | 8/1994 | Sakamoto | 257/534 |
| 5,436,568 A | 7/1995 | Woith | 324/758 |
| 5,461,328 A | 10/1995 | Devereaux et al. | 324/765 |
| 5,479,109 A | 12/1995 | Lau et al. | 324/758 |
| 6,685,164 B1 * | 2/2004 | Koizumi et al. | 92/103 F |
| 6,796,215 B1 * | 9/2004 | Hauser et al. | 92/96 |

FOREIGN PATENT DOCUMENTS

WO 2004008053 1/2004

* cited by examiner

*Primary Examiner*—Michael Leslie
(74) *Attorney, Agent, or Firm*—Michael B. Einschlag

(57) ABSTRACT

One embodiment of the present invention is a mounting apparatus that includes: (a) a first ring having a first surface and a second surface; (b) a second ring having a first surface and a second surface, which second ring is movable with respect to the first ring; (c) a first flexible diaphragm attached to: (i) the first surface of the first ring along a first-surface-first-ring attachment perimeter that encloses a first effective surface area, and (ii) the first surface of the second ring along a first-surface-second-ring attachment perimeter; and (d) a second flexible diaphragm attached to: (i) the second surface of the first ring along a second-surface-first-ring attachment perimeter that encloses a second effective surface area, and (ii) the second surface of the second ring at a second-surface-second-ring attachment perimeter; wherein: the first and second flexible diaphragms and the first and second rings form a chamber with one or more intake apertures.

21 Claims, 6 Drawing Sheets

*Fig. 2B*   B - B'

MOUNTING APPARATUS

CROSS-REFERENCES TO RELATED APPLICATIONS

This patent application is related to U.S. patent application entitled: "Apparatus Including a Fluid Coupler Interfaced to a Test Head," which application is commonly assigned with this application, is filed the same day as this application, and has the same inventors as this application.

This patent application relates to U.S. Provisional Application No. 60/800,830 filed May 15, 2006, from which priority is claimed under 35 USC §119(e), and which provisional application is incorporated herein in its entirety.

TECHNICAL FIELD OF THE INVENTION

One or more embodiments of the present invention relate to a mounting apparatus, and in particular, to a mounting apparatus for a test head.

BACKGROUND OF THE INVENTION

During manufacture, electronic devices are tested to assess their functionality and reliability. Such testing may involve electrical, magnetic, optical, thermal, mechanical, and other testing operations.

Such testing typically entails using a test head that is positioned on a surface of the electronic device. Typically, the test head is supported on a mounting mechanism, such as a cam-actuated clamp, that provides a controlled force to urge the test head into good contact with the electronic device. For example, in testing high power electronic devices, the test head is used typically to press the electronic device into a socket while providing a controlled temperature surface—the controlled temperature surface maintains the electronic device at a predetermined temperature during the testing procedure.

In demanding applications, the mounting mechanism enables the test head to tilt to accommodate small misorientations of the electronic device, and to bring the test head into parallel contact with a surface of the electronic device. A typical mounting mechanism uses flexible members such as pivoted mountings, gimbal mountings, springs, flexible vertical bellows, and the like to accommodate such small misorientations. However, these flexible members often block access to the electronic device that is needed for test wires, tubes, and other connections.

An advanced electronic device having a large number of contacts requires a large force (i.e., a clamping force) to urge it into a socket. As an example, a total clamping force of about 72 kg is required to clamp an Application Specific Integrated Circuit (ASIC) device with 2400 Input/Output (I/O) solder balls into a spring pin socket requiring a clamping force of 30 gm/contact. This necessitates use of a clamping mechanism that provides a mechanical advantage or a mechanized clamp. Thus, in some applications, a pneumatic cylinder clamping mechanism is used to urge an electronic device into a socket. Typical pneumatic cylinders and pneumatically actuated clamping mechanisms take up a large amount of space on a tester, thereby blocking access to the electronic device that is needed for test wires, tubes, and other connections.

In light of the above, there is a need in the art for a mounting apparatus, and in particular, to a mounting apparatus for a test head that solves one or more of the above-identified problems.

SUMMARY OF THE INVENTION

One or more embodiments of the present invention solve one or more of the above-identified problems. In particular, one embodiment of the present invention is a mounting apparatus that comprises: (a) a first ring having a first surface and a second surface; (b) a second ring having a first surface and a second surface, which second ring is movable with respect to the first ring; (c) a first flexible diaphragm attached to: (i) the first surface of the first ring along a first-surface-first-ring attachment perimeter that encloses a first effective surface area, and (ii) the first surface of the second ring along a first-surface-second-ring attachment perimeter; and (d) a second flexible diaphragm attached to: (i) the second surface of the first ring along a second-surface-first-ring attachment perimeter that encloses a second effective surface area, and (ii) the second surface of the second ring at a second-surface-second-ring attachment perimeter; wherein: the first and second flexible diaphragms and the first and second rings form a chamber with one or more intake apertures.

BRIEF DESCRIPTION OF THE DRAWING

FIGS. 2B and 2C are cross sectional views of the test head mounting apparatus shown in FIG. 2A for two different states of vertical deflection;

DETAILED DESCRIPTION

Figure 1A:
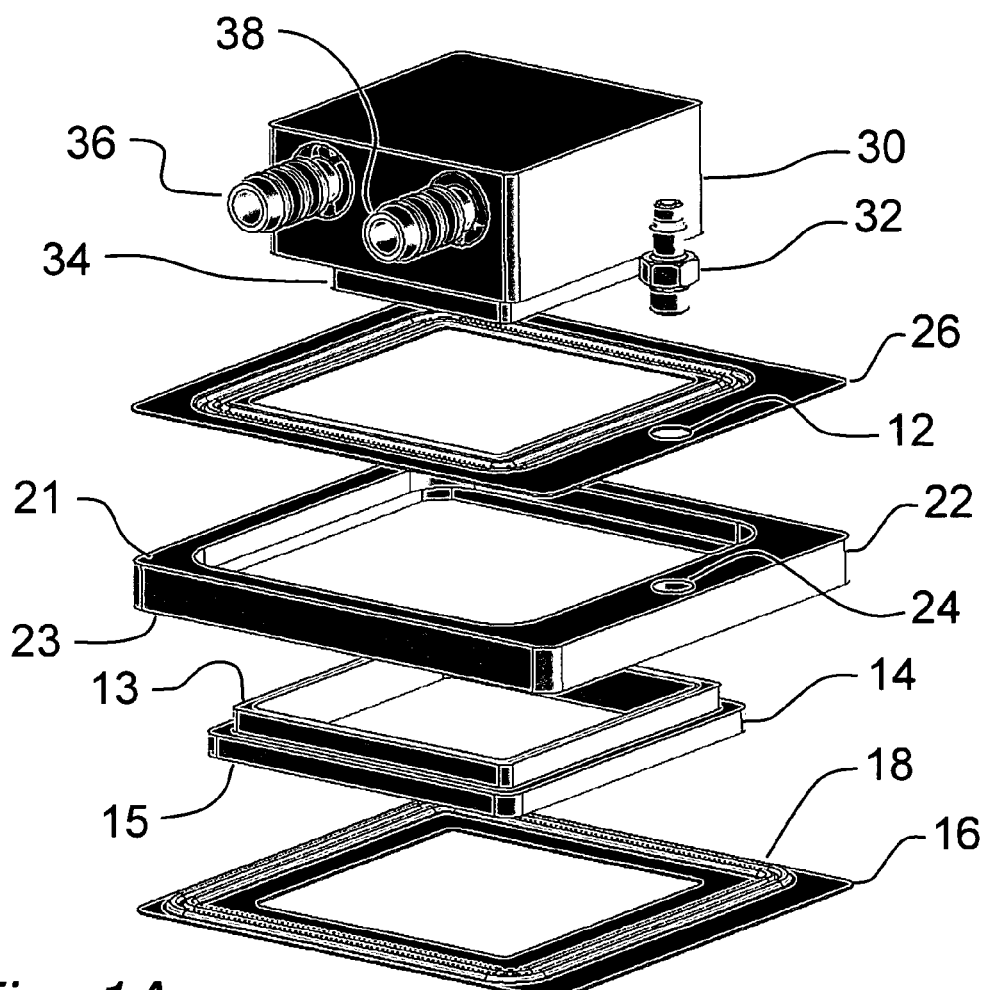
FIG. 1A is an exploded view of an assembly of a test head mounting apparatus and a thermal test head that is fabricated in accordance with one or more embodiments of the present invention.
Figure 1B:
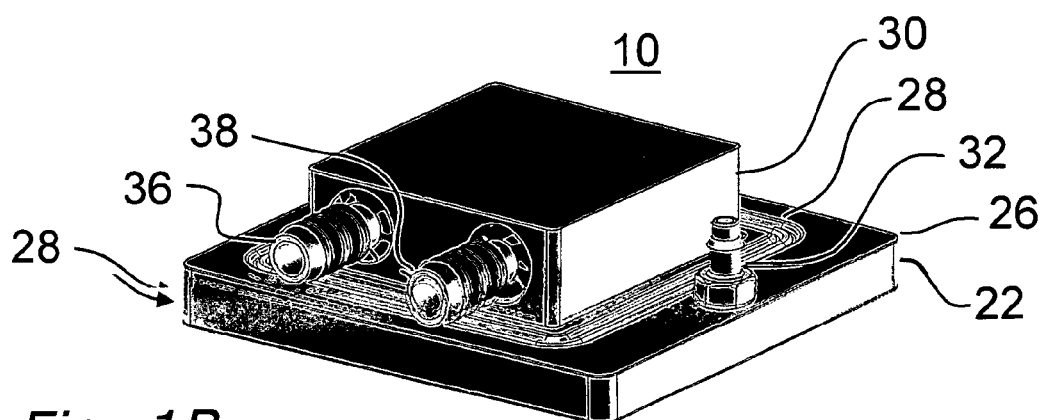
FIG. 1B is a perspective view of the assembly shown in FIG. 1A.

FIG. 1A is an exploded view of assembly 10 that is fabricated in accordance with one or more embodiments of the present invention, and FIG. 1B is a perspective view of assembly 10. Assembly 10 comprises thermal test head 34 (refer to FIG. 1A) and test head mounting apparatus 28 (refer to FIG. 1B). As indicated by FIG. 1A, thermal test head 34 (including an associated fluid manifold 30) is mounted within an opening in movable ring 14 of test head mounting apparatus 28. As further indicated by FIG. 1A, thermal test head 34 is held by movable ring 14, and movable ring 14, in turn, is attached: (a)

on its top surface 13, to flexible diaphragm 26; and (b) on its bottom surface 15, to flexible diaphragm 16. As further indicated by FIG. 1A: (a) an outer peripheral portion of flexible diaphragm 16 is attached to bottom surface 23 of fixed ring 22; and (b) an outer peripheral portion of flexible diaphragm 26 is attached to top surface 21 of fixed ring 22. As such, and in accordance with one or more embodiments of the present invention, a pressure chamber is formed by flexible diaphragm 26, flexible diaphragm 16, fixed ring 22, and movable ring 14.

In accordance with one or more embodiments of the present invention, thermal test head 34 and fluid manifold 30 are adapted for use in establishing and/or maintaining a predetermined temperature on an electronic device under test, and as such, couplers 36 and 38 are adapted to conduct fluid (for example and without limitation, cooling fluid) into and out of fluid manifold 30, respectively. As further shown in FIG. 1A, inlet 32 is provided for introducing fluid under pressure into the pressure chamber (formed by flexible diaphragm 26, flexible diaphragm 16, fixed ring 22, and movable ring 14) to cause movable ring 14 and mounted thermal test head 34 to move in a vertical direction (i.e., a direction substantially normal to a plane of top surface 21 of fixed ring 22) in a manner to be described in detail below. In particular, and as will be described in detail below, movable ring 14 (and thereby mounted thermal test head 34) can be moved in the vertical direction by distention of flexible diaphragms 26 and 16.

As further indicated by FIG. 1A, inlet 32 extends into the pressure chamber through aperture 12 in flexible diaphragm 26 and channel 24 in fixed ring 22. As will be described in detail below, flexibility of flexible diaphragms 26 and 16 provides a measure of gimbal mount action by enabling tilt of movable ring 14. As a result, the vertical motion and tilt of mounted test head thermal test head 34 facilitate urging of thermal test head 34 against a surface of a device under test.

Although assembly 10 comprises test head mounting apparatus 28 and thermal test head 34, it should be understood that further embodiments of the present invention may be fabricated wherein thermal test head 34 is any movable device known to those of ordinary skill in the art such as, for example and without limitation, a thermal test head, an electrical probe head, an optical probe, or a photolithographic clamp.

Figure 2A:
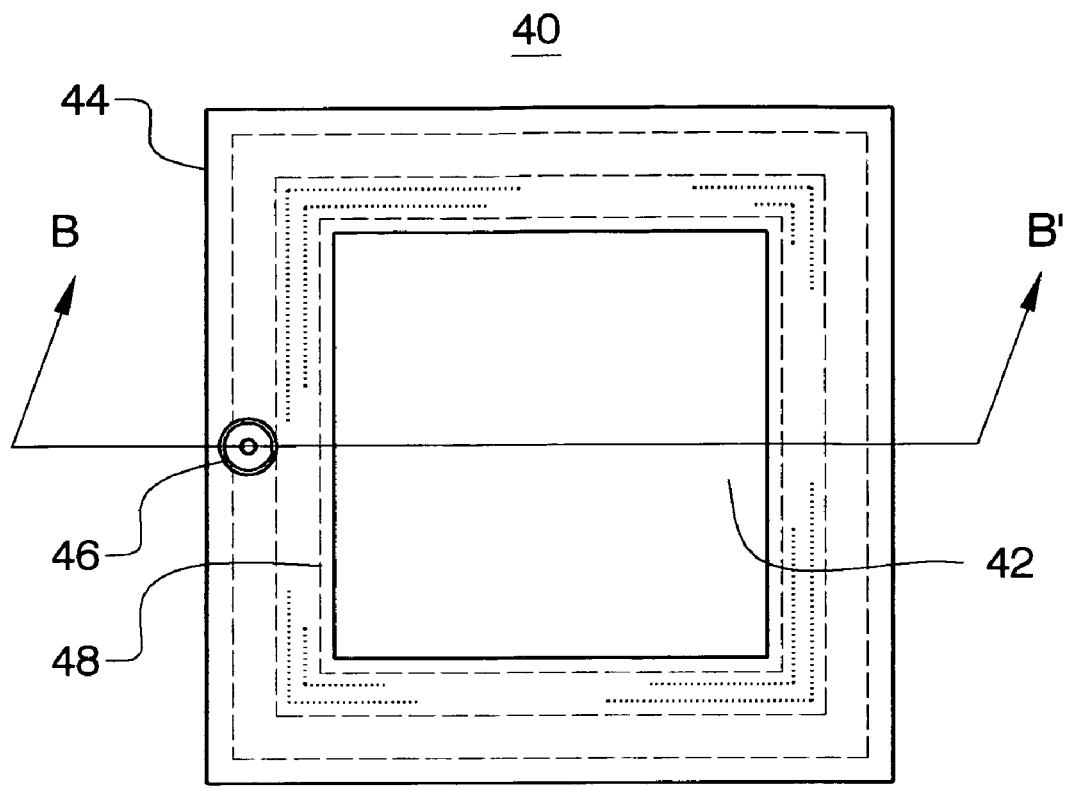
FIG. 2A is a top view of a test head mounting apparatus that is fabricated in accordance with one or more embodiments of the present invention.
Figure 2C:
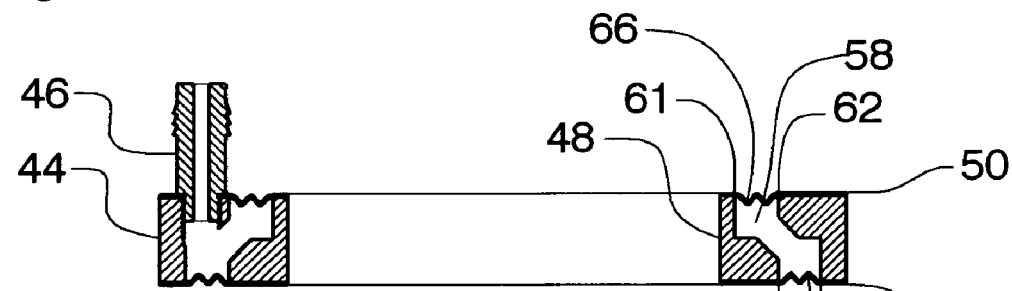
Figure 2C:
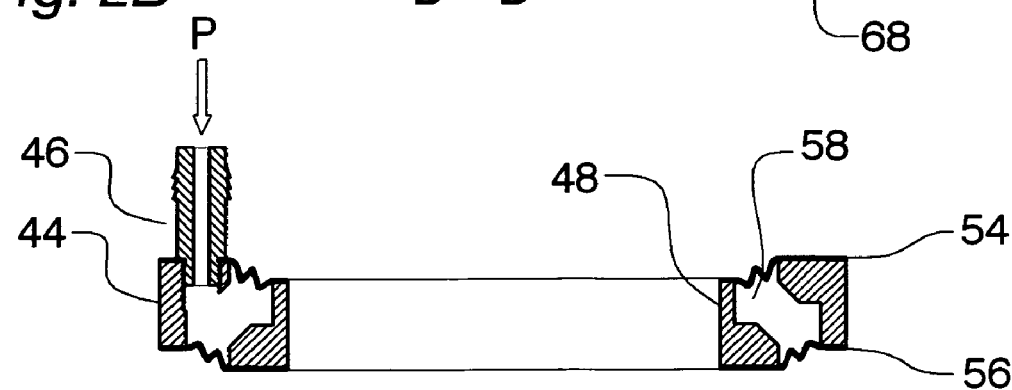

FIG. 2A is a top view of test head mounting apparatus 40 that is fabricated in accordance with one or more embodiments of the present invention wherein mounting hole 42 is a square. Test head mounting apparatus 40 shown in FIG. 2B is a top view of exploded test head mounting apparatus 28 shown in FIG. 1A, and test head mounting apparatus 40 represents an assembly of the following elements shown in FIG. 1A: (a) flexible diaphragm 26 of FIG. 1A corresponds to flexible diaphragm 50 of FIG. 2B; (b) fixed ring 22 of FIG. 1A corresponds to fixed ring 44 of FIG. 2B; (c) movable ring 14 of FIG. 1A corresponds to movable ring 48 of FIG. 2B; and (d) flexible diaphragm 16 of FIG. 1A corresponds to flexible diaphragm 52 of FIG. 2B. FIGS. 2B and 2C are cross sectional views of test head mounting apparatus 40 for two different states of vertical deflection: (a) FIG. 2B is a cross sectional view of test head mounting apparatus 40 in a quiescent position; and (b) FIG. 2C is a cross sectional view of test head mounting apparatus 40 in an actuated state in which a downward vertical deflection of movable ring 48 is caused by introduction of a fluid at pressure P into inlet 46.

In the quiescent position of test head mounting apparatus 40 shown in FIG. 2B, flexible diaphragms 50 and 52 are relatively planar and are not distended. As shown in FIG. 2B, top flexible diaphragm 50 is attached on: (a) an inner portion, to movable ring 48; and (b) an outer portion, to fixed ring 44. As further shown in FIG. 2B, bottom flexible diaphragm 52 is attached on: (a) an inner portion, to movable ring 48; and (b) an outer portion, to fixed ring 44. In accordance with one or more embodiments of the present invention: (a) fixed ring 44 and movable ring 48 are fabricated of 304 stainless steel, although any relatively rigid material may be used; (b) mounting hole 42 is approximately 25 mm square; (c) an outer dimension of fixed ring 44 is approximately 40 mm square; (d) flexible diaphragms 50 and 52 are each formed from an approximately 0.05 mm thick, stainless steel sheet that has been embossed with two circumferential grooves 66 and 68, respectively, to increase flexibility; and (e) flexible diaphragms 50 and 52 are brazed to movable ring 48 and to fixed ring 44 by, for example and without limitation, a cu-sil braze alloy. However, in accordance with one or more further embodiments of the present invention, the flexible diaphragms may be made from monel, nickel alloys, waspalloy, rubber, organic films, polyimide, superplastic metals, and other resilient materials. In addition, and in accordance with one or more still further embodiments of the present invention, the flexible diaphragms may be made from thin foils of metal such as, for example and without limitation, beryllium-copper alloy, brass, bronze, stainless steel, titanium, titanium alloy, nickel alloy, nitinol, and other alloys of high yield strength. In addition, and in accordance with one or more still further embodiments of the present invention, the flexible diaphragms may be made from thin sheets of elastic material such as, for example and without limitation, polyamide, silicone, rubber, polyurethane, urethane, and polymer materials that exhibit low creep. In further addition, and in accordance with one or more further embodiments of the present invention, the flexibility of the diaphragms may be enhanced by use of one or more concentric grooves, one or more spiral grooves, one or more radial grooves, one or more thin multi-layer sheets, one or more selectively thinned sections, one or more embossed grooves, a combination of any of the foregoing, or structures fabricated in accordance with any one of a number of other techniques that are well known to those of ordinary skill in the art.

As shown in FIG. 2A, flexible diaphragms 50 and 52 of test head mounting apparatus 40 are approximately square. However, it is within the scope of the present invention that further embodiments of the present invention may be fabricated wherein flexible diaphragms 50 and/or 52 may be, for example and without limitation, circular, oval, oblong, square, rectangular, or any other shape, including an irregular shape.

As used herein, an attachment perimeter is a boundary line that delineates a line of attachment between a flexible diaphragm and a fixed or a movable ring—at an inner perimeter of the fixed or movable ring. In accordance with one or more embodiments of the present invention, an attachment perimeter for a flexible diaphragm may be, for example and without limitation, circular, oval, oblong, square, rectangular, or any other shape, including irregularly shaped.

In accordance with one or more embodiments of the present invention, test head mounting apparatus 40 is actuated by injecting compressed air at pressure P through inlet 46 into chamber 58 formed by flexible diaphragms 50 and 52, fixed ring 44, and movable ring 48—pressure P is measured relative to an ambient pressure of air surrounding test head mounting apparatus 40. In accordance with one or more embodiments of the present invention flexible diaphragm 50 may not be identical to flexible diaphragm 52 in one or more of the following respects: (a) a flexible area of flexible diaphragm 50 that is enclosed between attachment perimeter 62

("first fixed attachment perimeter") and attachment perimeter 61 ("first movable attachment parameter") may not be equal to a flexible area of flexible membrane 52 enclosed between attachment perimeter 64 ("second fixed attachment perimeter") and attachment perimeter 63 ("second movable attachment parameter"); (b) a variation of flexibility of flexible membrane 50 with distance from a center line of test head mounting apparatus 40 may be different from a variation of flexibility of flexible membrane 52 with distance from the center line; or (c) a variation between the flexible diaphragms in one or more of torsional modulus, elastic modulus, thickness, shape, or deviation from planarity as they distend during deflection. As can be understood with reference to FIG. 2B for purposes of determining movement in a vertical direction, pressure P acts upwardly upon an upward facing effective surface area in chamber 58 enclosed within attachment perimeter 62 of flexible diaphragm 50, and downwardly upon a larger downward facing effective surface area in chamber 58 enclosed within attachment perimeter 64 of flexible diaphragm 52 to produce a net force F that displaces movable ring 48 downwardly. As used herein, an effective surface area is a surface area projected onto a plane (for example and without limitation, a plane normal to a vertical direction). For most purposes, for substantially planar surface areas, the surface area is substantially equal to the effective surface area. In addition, to determine the net force F, one may also approximate an effective flexible surface area of a flexible diaphragm by a surface area of the flexible membrane (when no fluid or gas is injected into mounting apparatus 40) that is disposed between a fixed attachment perimeter (i.e., attachment perimeter for attachment to a fixed ring) and a movable attachment perimeter (i.e., attachment perimeter for attachment to a movable ring).

As shown in FIG. 2C, flexible diaphragms 50 and 52 of FIG. 2B are distended to shapes representatively shown as flexible diaphragms 54 and 56. Because of the flexibility of flexible diaphragms 50 and 52, movable ring 48 is able to move downward vertically (i.e., in a direction substantially normal to a plane of a top surface of fixed ring 44) in response to the net force F developed by pressure P. Further, in accordance with one or more such embodiments, in addition to the downward vertical motion, as illustrated by distended flexible diaphragms 54 and 56 shown in FIG. 2C, the flexure enables movable ring 48 to tilt through a small angle as in a gimbal mounting.

Figure 3A:
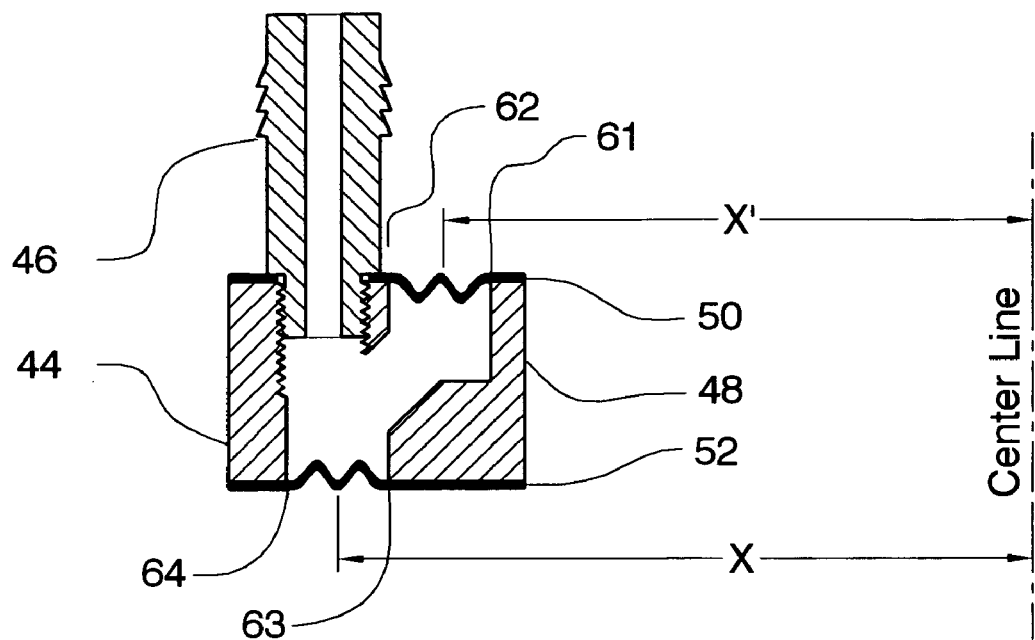
FIGS. 3A and 3B are cross sectional views of portions of the test head mounting apparatus shown in FIG. 2A for two different states of vertical deflection.
Figure 3B:
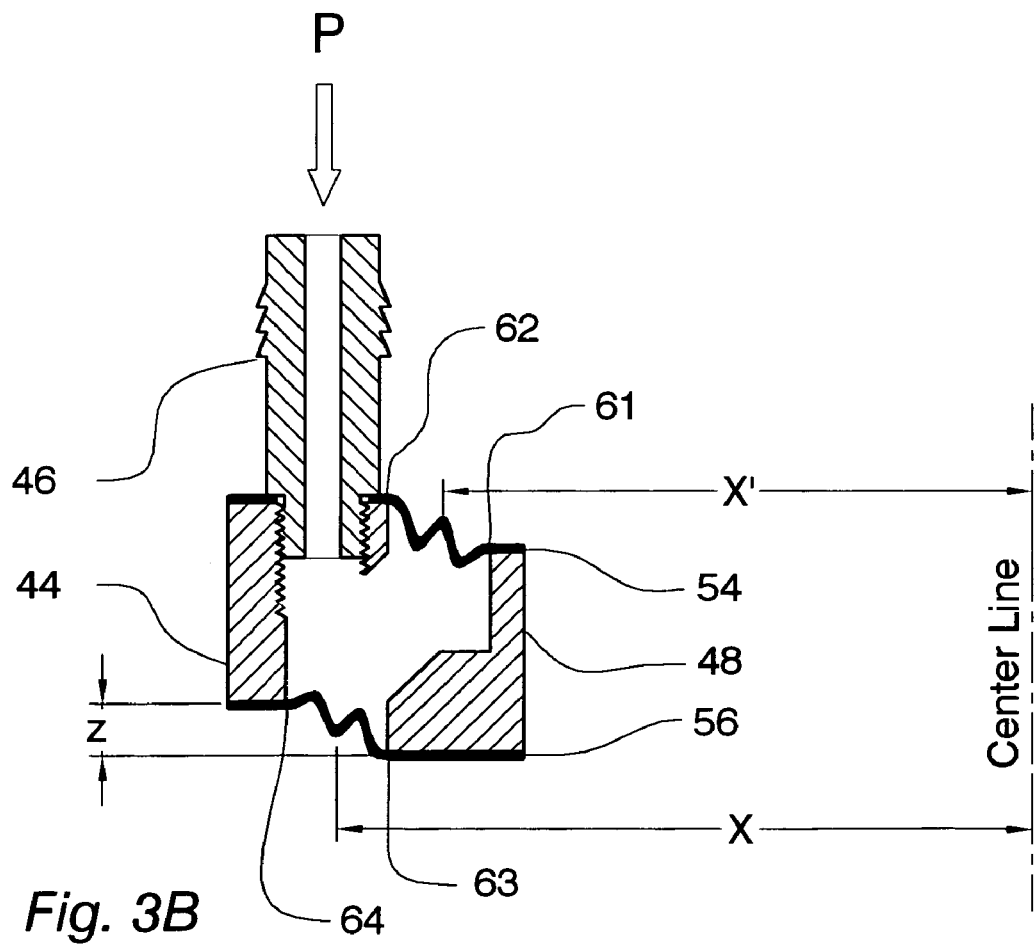

The operation of test head mounting apparatus 40 is further understood by reference to FIGS. 3A and 3B. FIG. 3A is a cross sectional view of a portion of test head mounting apparatus 40 in a quiescent position wherein flexible diaphragms 50 and 52 are relatively planar; and FIG. 3B is a cross sectional view of test head mounting apparatus 40 in an actuated state in which a downward vertical deflection of movable ring 48 is caused by introduction of a fluid (for example and without limitation, compressed air) at pressure P into inlet 46. As shown in FIG. 3A: (a) a flexible portion of top flexible diaphragm 50 is rigidly attached to fixed ring 44 along attachment perimeter 62 and is rigidly attached to movable ring 48 along attachment perimeter 61; and (b) a flexible portion of bottom flexible diaphragm 52 is rigidly attached to fixed ring 44 along attachment perimeter 64 and is rigidly attached to movable ring 48 along attachment perimeter 63.

As one of ordinary skill in the art can readily appreciate, a net vertical force F acting on movable ring 48 (caused by hydrostatic pressure P of fluid in chamber 58) depends upon properties of flexible diaphragm 50 and flexible diaphragm 52. In general, one or more of the following properties of flexible diaphragm 50 and flexible diaphragm 52 are relevant to determining the net force: (a) for flexible diaphragm 50, an area enclosed between attachment perimeter 61 and attachment perimeter 62, a pattern (for example, a distribution with respect to distance to the center line shown in FIGS. 3A and 3B) of material flexibility, torsional modulus, elastic modulus, thickness, and shape; and (b) for flexible diaphragm 52, an area enclosed between attachment perimeter 63 and attachment perimeter 64, a pattern of material flexibility, torsional modulus, elastic modulus, thickness, and shape. In an embodiment wherein the relevant properties of flexible diaphragm 50 and 52 are substantially identical and the upwardly and downwardly facing effective surface areas in the chamber are substantially equal, the net vertical force F (caused by hydrostatic pressure P of fluid) is substantially zero. Thus, in order that hydrostatic pressure P of the fluid cause a significant net force F, the relevant properties of flexible diaphragms 50 and 52 and/or the upwardly and downwardly facing effective surface areas in the chamber should not be identical. In other words, in order for pressure P to produce a net force F, the upwardly and downwardly facing effective surface areas in the chamber must differ and/or flexible diaphragms 50 and 52 must differ in at least one relevant property including, but not limited to, areas enclosed within between a fixed and a movable attachment perimeter, or a pattern of material flexibility of a flexible diaphragm.

For illustrative purposes, a net downward vertical force F caused by compressed air at pressure P can be estimated for the embodiment shown in FIG. 3A where: (a) vertical displacement of movable ring 48 is small; (b) a distance between attachment perimeters 62 and 61 of flexible diaphragm 50 is much smaller than a distance X' from a mid point of their separation to a center line of movable ring 48 (refer to FIGS. 3A and 3B); (c) a distance between attachment perimeters 64 and 63 of flexible diaphragm 52 is much smaller than a distance X from a mid point of their separation to the center line; and (d) the flexibility of flexible diaphragm 50 is substantially equal to the flexibility of flexible diaphragm 52. In accordance with such an embodiment, the net downward vertical force F is approximately equal to pressure P times a difference between a bottom effective surface area and a top effective surface area—where a top effective surface area relates to flexible diaphragm 50, and a bottom effective surface area relates to flexible diaphragm 52. As one can readily appreciate from this, a net downward vertical force F causes movable ring 48 to be displaced downward by a distance Z (refer to FIG. 3B, which distance Z is limited by resilience of distended flexible diaphragms 54 and 56. Hence, in accordance with one or more embodiments of the present invention, the net downward vertical force F exerted by test head mounting apparatus 40 can be controlled by regulating pressure P of compressed air injected through inlet 46.

Figure 4A:
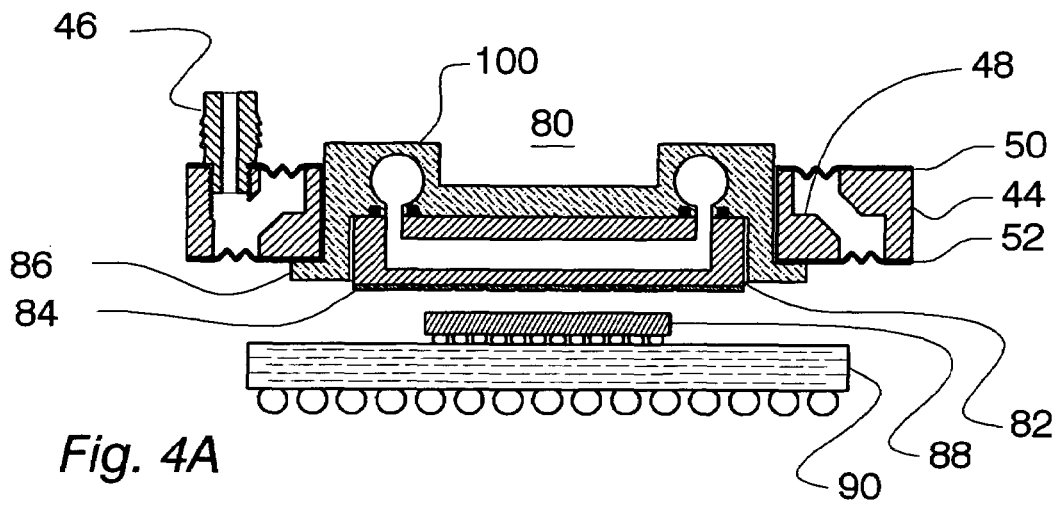
FIGS. 4A, 4B, and 4C are cross sectional views of an assembly of a test head mounting apparatus and a thermal test head, which assembly is fabricated in accordance with one or more embodiments of the present invention, and which assembly is shown in three different states of deflection useful in testing an electronic device.
Figure 4B:
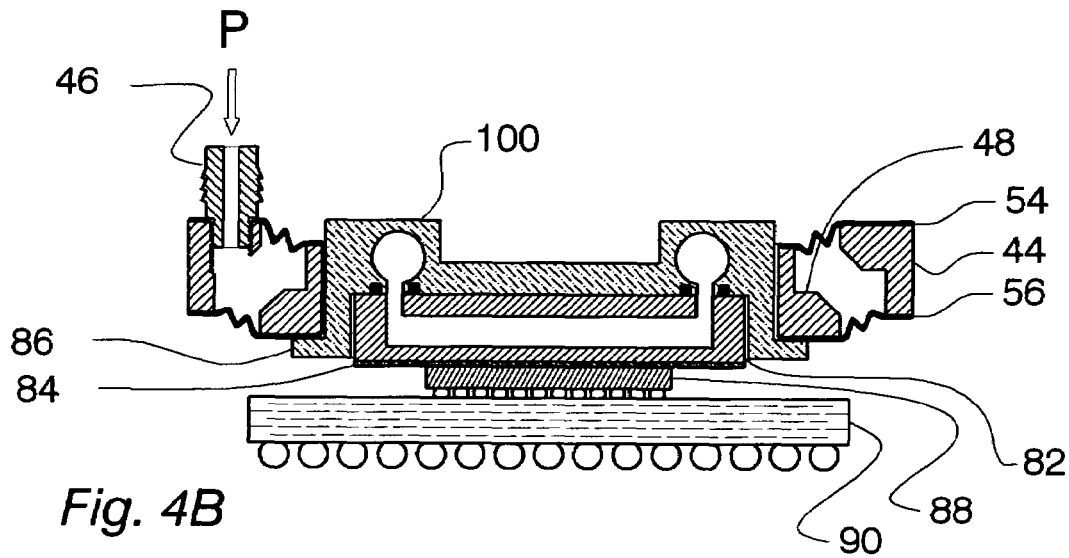
Figure 4C:
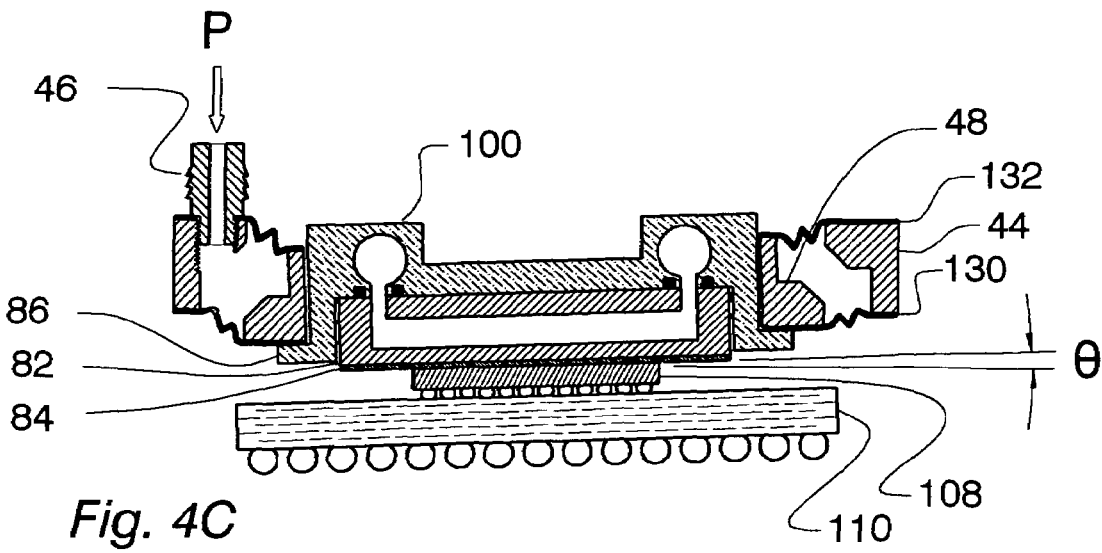

FIGS. 4A, 4B and 4C are cross sectional views of an assembly comprising test head mounting apparatus 40 and thermal test head 80, which assembly is fabricated in accordance with one or more embodiments of the present invention. FIG. 4A is a cross sectional view of the assembly in a quiescent position. As shown in FIG. 4A, test head mounting apparatus 40 is disposed so that it is able to urge cold plate 82 of thermal test head 80 against device under test 88 ("DUT 88"). As further shown in FIG. 4A, DUT 88 is mounted to wiring substrate 90 that interconnects it to an electronic test system (not shown). As further shown in FIG. 4A, cold plate 82 is attached to manifold 100 that is adapted to supply fluids (for example and without limitation) cooling fluids to cold plate 82. As further shown in FIG. 4A, manifold 100 is mounted to movable ring 48 by flange 86. Lastly, thermal interface material 84 (fabricated, for example and without limitation, from eGRAF HiTherm which is available from GrafTEch of Cleveland, Ohio) disposed on a bottom surface of cold plate 82 is adapted to provide good thermal contact to a top surface of DUT 88. As shown in FIG. 4A, in the quiescent position, flexible diaphragms 50 and 52 are substantially planar and cold plate 82 is at an initial position that is spaced above DUT 88.

As shown in FIG. 4B, in operation, a fluid (for example and without limitation, compressed air) at pressure P is injected through inlet 46. The pressure P of the fluid produces an unbalanced force on flexible diaphragms 54 and 56 (these are flexible diaphragms 54 and 56, respectively, shown in FIG. 2C in a distended position) and movable ring 48 (referring to the description above in conjunction with FIGS. 3A and 3B), and a resulting downward movement of movable ring 48. As a consequence, cold plate 82 is urged downwardly, thereby bringing thermal interface material 84 into contact with DUT 88. In accordance with one or more embodiments of the present invention, deformation of distended flexible diaphragms 54 and 56 enables the downward motion of movable ring 48, and thereby, manifold 100 and attached cold plate 82. Releasing pressure P of the fluid eliminates the unbalanced force, enables flexible diaphragms 50 and 52 to spring back and return movable ring 48 to its original quiescent position shown in FIG. 4A.

FIG. 4C is a cross sectional view of the assembly in operation for testing an imperfect electronic device, DUT 108, that is mounted on an imperfect wiring substrate, wiring substrate 110. For example, as a result of one or more typical imperfections, a top surface of DUT 88 may be tilted at an angle of Θ with respect to its usual orientation, for example, a horizontal orientation. However, advantageously, and in accordance with one or more embodiments of the present invention, flexibility of distorted flexible diaphragms 130 and 132 (these are flexible diaphragms 54 and 56, respectively, shown in FIG. 2C in a distended position) enables cold plate 82 to tilt to bring a surface of thermal interface material 84 into intimate, parallel contact with a top surface of DUT 108. As one can readily appreciate, flexibility of flexible diaphragms 130 and 132 provides a measure of gimbal mount action that enables tilting of movable ring 48 and an attached test head.

As one can appreciate from the above, one or more embodiments of the present invention provide a mechanism (test head mounting apparatus 40 in FIG. 4A) for clamping a test head (thermal test head 80 in FIG. 4A) to a device under test (DUT 88 in FIG. 4A) while allowing access for the test head and associated connections. In accordance with one or more such embodiments, the test head mounting apparatus applies force to a test head that is mounted in an aperture in a movable ring (movable ring 48 in FIG. 4A). In accordance with one or more such embodiments, the force is generated by fluid pressure inside a chamber formed between two flexible diaphragms (flexible diaphragms 50 and 52 in FIG. 4A) attached to the movable ring. In accordance with one or more such embodiments, a top flexible diaphragm (flexible diaphragm 50 in FIG. 4A) includes an effective surface area within an attachment perimeter that is smaller than an effective surface area included within an attachment perimeter of a bottom diaphragm (flexible diaphragm 52 in FIG. 4A), and applying excess pressure by a fluid such as, for example and without limitation, air, gas or oil between the top and the bottom flexible diaphragms generates a force that moves the movable ring in a downward vertical direction. As a result, the test head mounting apparatus generates a downward force that is used to urge the test head against a device under test, while providing an aperture for test probes, wires, fluid cables, microscope lenses, fiber optics and the like to be brought into proximity of a top of the device under test. In addition, as a result of flexure of the top and bottom flexible diaphragms, the test head is able to tilt to accommodate a tilt in a surface of the device under test (i.e., because of tilt of the test head, a plane of the test head can be brought into a position that is parallel to the surface of the device under test).

Figure 5A:
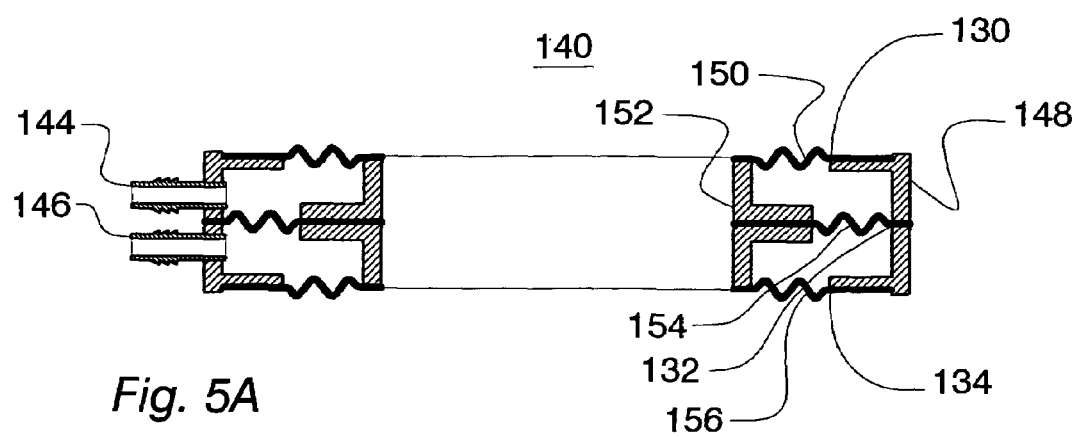
FIGS. 5A, 5B, and 5C are cross sectional views of a two-directional test head mounting apparatus that is fabricated in accordance with one or more embodiments of the present invention, which two-directional test head mounting apparatus is shown in three different states of deflection.
Figure 5B:
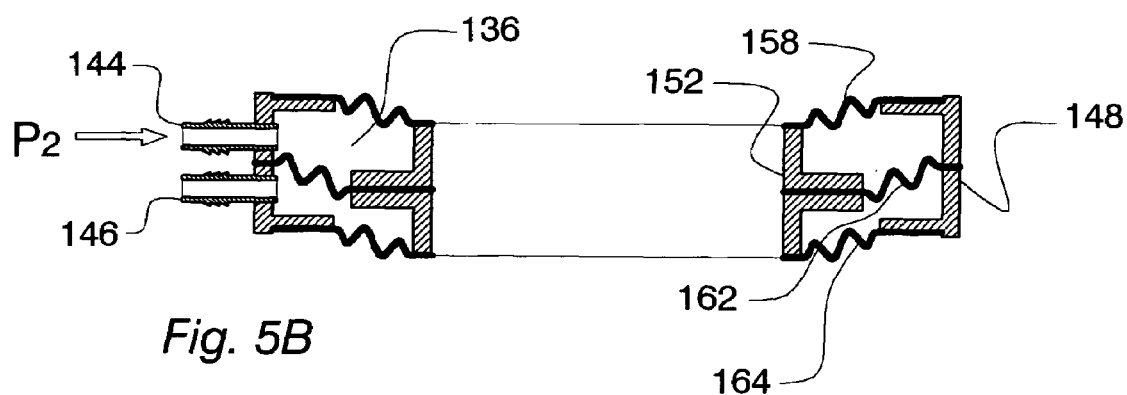
Figure 5C:
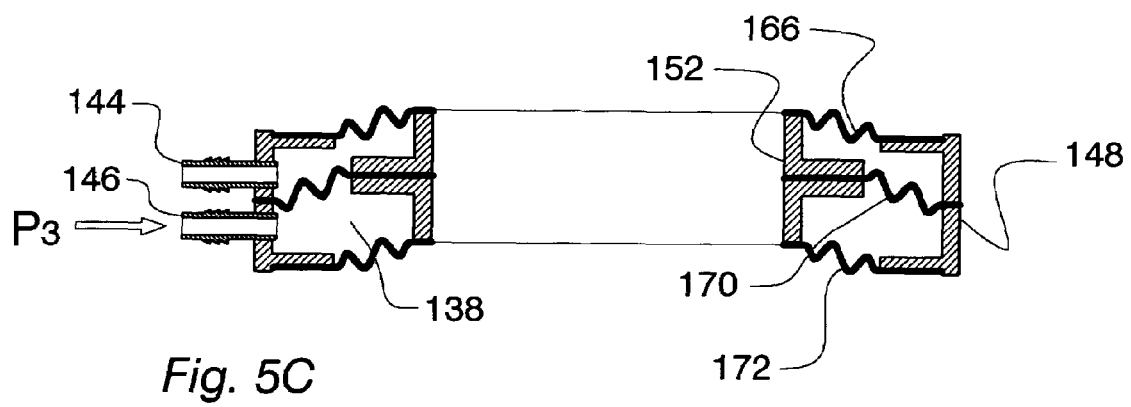

FIGS. 5A, 5B, and 5C are cross sectional views of two-directional test head mounting apparatus 140 that is fabricated in accordance with one or more embodiments of the present invention, which two-directional test head mounting apparatus 140 is shown in three different states of deflection. In accordance with one or more such embodiments, test head mounting apparatus 140 is configured to provide both downward movement and upward movement. As shown in FIG. 5A, movable ring 152 is held in a quiescent position by flexible diaphragms 150, 154, and 156. As further shown in FIG. 5A: (a) flexible diaphragm 150 is rigidly attached to fixed ring 148 along attachment perimeter 130, enclosing first effective surface area $A_1$; (b) flexible diaphragm 154 is rigidly attached to fixed ring 148 along attachment perimeter 132, enclosing second effective surface area $A_2$; and (c) flexible diaphragm 156 is rigidly attached to fixed ring 148 along attachment perimeter 134 enclosing third effective area $A_3$. In accordance with this embodiment, $A_1 < A_2$ and $A_3 < A_2$.

In order to actuate downward movement in accordance with one or more such embodiments, referring to FIG. 5B, a fluid (for example and without limitation, compressed air) at pressure $P_2$ is injected into inlet 144, thereby pressurizing chamber 136. Because second effective surface area $A_2$ is greater than first effective surface area $A_1$ in chamber 136, hydrostatic pressure in chamber 136 exerts an unbalanced downward force on movable ring 152, thereby causing it to move downward. In accordance with one or more such embodiments, distended flexible diaphragms 158, 162, and 164 (as shown in FIG. 5B, flexible diaphragms 150, 154, and 156 of FIG. 5A are distended to shapes representatively shown as flexible diaphragms 158, 162, and 164 of FIG. 5B) enable movable ring 152 to move downward in response to the unbalanced force.

In order to actuate upward movement in accordance with one or more such embodiments, referring to FIG. 5C, a fluid (for example and without limitation, compressed air) at pressure $P_3$ is injected into inlet 146, thereby pressurizing chamber 138. Because second effective surface area $A_2$ is greater than third effective surface area $A_3$ in chamber 138, hydrostatic pressure in chamber 138 exerts an unbalanced upward force on movable ring 152, thereby causing it to move upward. In accordance with one or more such embodiments, distended flexible diaphragms 166, 170, and 172 (as shown in FIG. 5C, flexible diaphragms 150, 154, and 156 of FIG. 5A are distended to shapes representatively shown as flexible diaphragms 166, 170, and 172 of FIG. 5C) enable movable ring 152 to move upward in response to the unbalanced force.

In accordance with one or more embodiments of the present invention, pressures $P_2$ and $P_3$ are determined with respect to ambient pressure surrounding test head mounting apparatus 140—as such, pressures $P_2$ or $P_3$ may be negative with respect to the ambient pressure. In accordance with one or more such embodiments of the present invention, a position of movable ring 152 may be actuated by: (a) using controlled pressures $P_2$ and $P_3$ simultaneously; and/or (b) controlling the ambient pressure by, for example and without limitation, vacuum surrounding test head mounting apparatus 140. For an embodiment wherein effective surface area $A_1$ equals effective surface area $A_3$, the unbalanced force on movable ring 152 is substantially unaffected by changes in ambient pressure. Further, as was described above in conjunction with FIGS. 2A-2C, the above-described structures that enable the various described net forces to be produced may also include differences in relevant properties of the flexible diaphragms such as, for example and without limitation, differences in flexibility patterns.

Figure 6A:
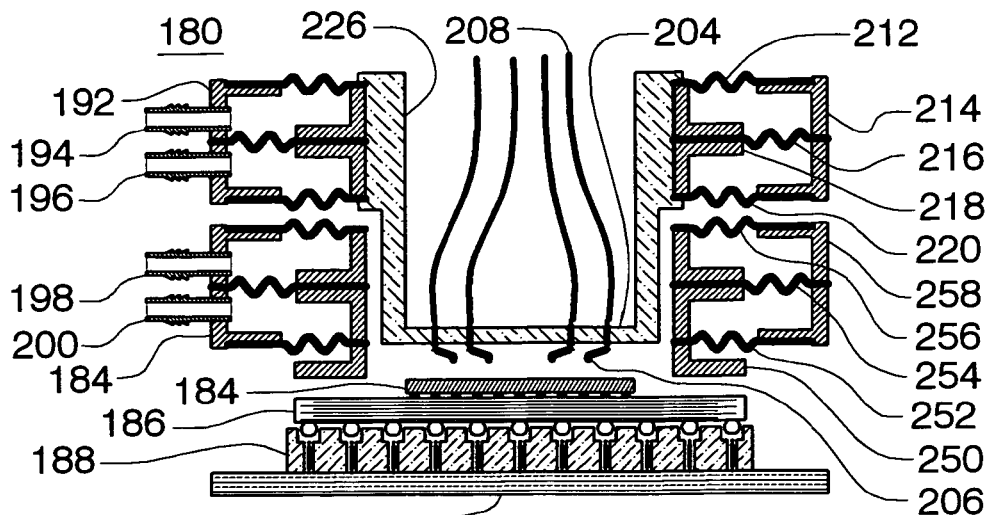
FIGS. 6A, 6B, and 6C are cross sectional views of a station for electrical testing of electronic devices that is fabricated is fabricated in accordance with one or more embodiments of the present invention, which station is shown in three states of deflection.
Figure 6B:
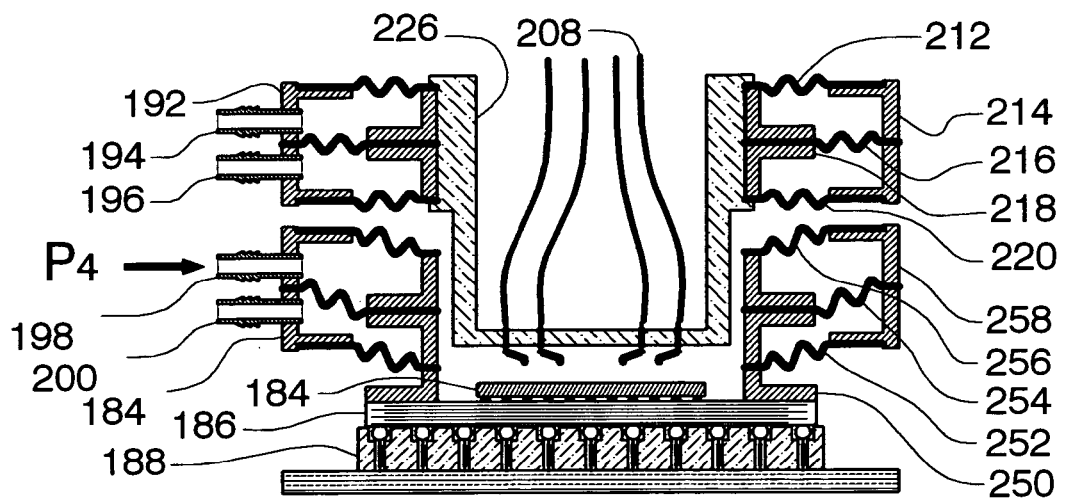
Figure 6C:
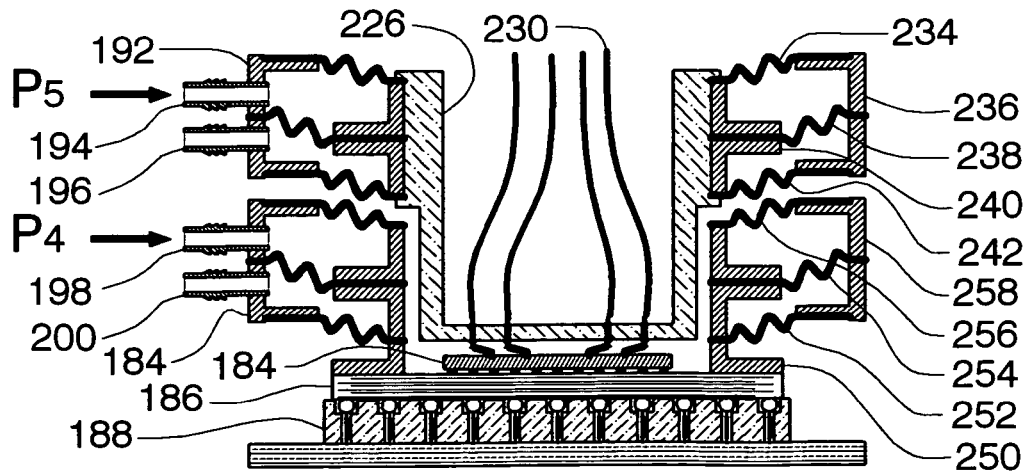

FIGS. 6A, 6B, and 6C are cross sectional views of a station configured for electrical testing of electronic devices that is fabricated is fabricated in accordance with one or more embodiments of the present invention. FIG. 6A is a cross sectional view of the station in a quiescent position. As shown in FIG. 6A, the station comprises electrical probe fixture 204 that is mounted to movable probe ring 218. Movable probe ring 218 and mounted electrical probe fixture 204 may be moved vertically by flexure of flexible diaphragms 212, 216, and 220. In accordance with one or more such embodiments, each of flexible diaphragms 212, 216, and 220 is sealed along outer attachment perimeters to stationary probe ring 214. In accordance with one or more embodiments of the present invention, stationary probe ring 214 is held in a stationary position with respect to printed wiring board 190 using any one of a number of mechanisms (not shown for sake of understanding the present invention) that are well known to those of ordinary skill in the art.

As further shown in FIG. 6A, electrical probe fixture 204 supports flexible leads 208 and probes 206 that are adapted to be connected to device under test 184 ("DUT 184"). In the quiescent position shown in FIG. 6A, probes 206 are positioned above DUT 184. As further shown in FIG. 6A, DUT 184 is attached to ball grid array substrate 186 which rests on socket 188, and socket 188 is mechanically and electrically attached to printed wiring board 190.

As further shown in FIG. 6A, the station includes an additional test head mounting apparatus that comprises stationary clamp ring 258, movable clamp ring 250, inlets 198 and 200, and flexible diaphragms 252, 254, and 256. In accordance with one or more embodiments of the present invention, stationary clamp ring 258 is held in a stationary position with respect to printed wiring board 190 using any one of a number of mechanisms (not shown for sake of understanding the present invention) that are well known to those of ordinary skill in the art. In the quiescent position shown in FIG. 6A, movable clamp ring 250 is positioned above ball grid array substrate 186.

FIG. 6B shows a configuration of the station after a first step in testing DUT 184 wherein ball grid array substrate 186 has been urged into socket 188 by force applied from movable clamp ring 250. To cause this first step, compressed air of pressure $P_4$ is injected into inlet 198 to cause movable clamp ring 250 to move downward. Because the effective surface area enclosed by the attachment perimeter of flexible diaphragm 256 is smaller than the effective surface area enclosed by the attachment perimeter of flexible diaphragm 254, pressure $P_4$ causes a net downward clamping force to act upon movable clamping ring 250. As one can readily appreciate, the clamping force is controlled by adjusting pressure $P_4$.

FIG. 6C shows a configuration of the station after a second step in testing DUT 184 wherein probes 206 on probe fixture 204 are moved downward and urged against a top surface of DUT 184. To cause this second step, compressed air of pressure $P_5$ is injected into inlet 194 to cause movable probe ring 218 to move downward. Because the effective surface area enclosed by the attachment perimeter of flexible diaphragm 212 is smaller than the effective surface area enclosed by the attachment perimeter of flexible diaphragm 216, pressure $P_5$ causes a net downward probe force to act upon movable clamping ring 218. As one can readily appreciate, the probe force is controlled by adjusting pressure $P_5$.

In accordance with one or more embodiments of the present invention, after completion of the electrical testing, electrical probe fixture 204 and associated probes 206 are retracted upward and away from DUT 184 by: (a) eliminating pressure $P_5$; and (b) injecting compressed air into inlet 196. Then, the clamping action of movable clamp ring 250 is reversed by: (a) eliminating pressure $P_4$; and (b) injecting compressed air into inlet 200 thereby moving clamp ring 250 upward. Alternatively, the clamping force applied by movable clamp ring 250 can be relaxed by eliminating pressure $P_4$, thereby allowing resilience of flexible diaphragms 252, 254, and 256 to retract movable clamp ring 250 upward toward the quiescent position. Further, as was described above in conjunction with FIGS. 2A-2C, the above-described structures that enable the various described net forces to be produced may also include differences in relevant properties of the flexible diaphragms such as, for example and without limitation, differences in flexibility patterns.

As one can appreciate from the above, test head mounting apparatus that are fabricated in accordance with the present invention can be utilized to provide a force to move a test head toward a surface of a device under test, and subsequently to provide a force to move the test head away from the surface of the device under test. Further, such a test head mounting apparatus may be used to help carry out any one of a number of different tests such as, for example and without limitation, to apply electrical probes to a device, to apply a thermal contact to a device, to position optical probes on a device, to clamp a device into a mating socket, to clamp a photolithographic mask, and generally, to use fluid pressure to actuate motion.

The embodiments of the present invention described above are exemplary. Many changes and modifications may be made to the disclosure recited above while remaining within the scope of the invention. For example, although embodiments were described that utilized rings, such as fixed rings and movable rings, it should be understood by those of ordinary skill in the art that the term rings may also be considered, for example and without limitation, to refer to appropriate portions of walls of manifolds. In addition, materials, methods, and mechanisms suitable for fabricating embodiments of the present invention have been described above by providing specific, non-limiting examples and/or by relying on the knowledge of one of ordinary skill in the art. Materials, methods, and mechanisms suitable for fabricating various embodiments or portions of various embodiments of the present invention described above have not been repeated, for sake of brevity, wherever it should be well understood by those of ordinary skill in the art that the various embodiments or portions of the various embodiments could be fabricated utilizing the same or similar previously described materials, methods or mechanisms. Further, as was described above, a net force generated using top and bottom flexible diaphragms depends on a number of factors such as, for example and without limitation: (a) a difference in area enclosed between attachment perimeters to a fixed and a movable ring, respectively (which difference in area may be due to, among other things, to differences in shapes for such attachment perimeters); (b) non-uniformities in flexibility of the diaphragms, or (c) basically, any difference between the two diaphragms.

Further, although embodiments of the present invention were described wherein an inner ring is movable and an outer ring is fixed, it should be understood by one of ordinary skill in the art that further embodiments of the present invention exist wherein the outer ring is movable and the inner ring is fixed or wherein an inner ring and an outer ring are movable relative to each other—in addition, in light of the description above, it will be clear to one of ordinary skill in the art how to fabricate such further embodiments routinely and without undue experimentation. The scope of the invention should therefore be determined not with reference to the above description, but instead should be determined with reference to the appended claims along with their full scope of equivalents.

What is claimed is:

1. A mounting apparatus that comprises:
a first ring having a first surface and a second surface;
a second ring having a first surface and a second surface, which second ring is movable with respect to the first ring;
a first flexible diaphragm attached to: (i) the first surface of the first ring along a first-surface-first-ring attachment perimeter that encloses a first effective surface area, and (ii) the first surface of the second ring along a first-surface-second-ring attachment perimeter; and
a second flexible diaphragm attached to: (i) the second surface of the first ring along a second-surface-first-ring attachment perimeter that encloses a second effective surface area, and (ii) the second surface of the second ring along a second-surface-second-ring attachment perimeter;
wherein:
the first and second flexible diaphragms and the first and second rings form a chamber with one or more intake apertures; and
the first effective surface area is different from the second effective surface area.

2. The mounting apparatus of claim 1 wherein the first flexible diaphragm and the second flexible diaphragm differ in one or more properties.

3. The mounting apparatus of claim 1 wherein the first effective surface area is less than the second effective surface area.

4. The mounting apparatus of claim 1 wherein the first effective surface area is greater than the second effective surface area.

5. The mounting apparatus of claim 1 wherein one or more of. the first and second flexible diaphragms comprise thin foils of metal.

6. The mounting apparatus of claim 5 wherein the metal comprises one or more of beryllium-copper alloy, brass, bronze, stainless steel, titanium, titanium alloy, nickel alloy, or nitinol.

7. The mounting apparatus of claim 1 wherein one or more of the first and second flexible diaphragms comprise one or more concentric rings.

8. The mounting apparatus of claim 1 wherein one or more of the first and second flexible diaphragms comprise one or more spiral grooves.

9. The mounting apparatus of claim 1 wherein one or more of the first and second flexible diaphragms are thin sheets of elastic material comprised of one or more of polyimide, polyamide, silicone, rubber, polyurethane or urethane.

10. The mounting apparatus of claim 1 wherein one or more of the first and second rings are rigid.

11. The mounting apparatus of claim 1 wherein there is an aperture in the movable ring.

12. A mounting apparatus comprising:
a first ring having a first surface and a second surface;
a second ring having a first surface and a second surface, which second ring is movable with respect to the first ring;
a first flexible diaphragm attached to: (i) the first surface of the first ring along a first-surface-first-ring attachment perimeter that encloses a first effective surface area, and (ii) the first surface of the second ring along a first-surface-second-ring attachment perimeter;
a second flexible diaphragm attached to: (i) the second surface of the first ring along a second-surface-first-ring attachment perimeter that encloses a second effective surface area, and (ii) the second surface of the second ring along a second-surface-second-ring attachment perimeter; and
an intermediate flexible diaphragm attached to: (i) the first ring at a first intermediate attachment perimeter disposed between the first and second surfaces of the first ring, which first intermediate attachment perimeter encloses an intermediate effective surface area, and (ii) the second ring at a second intermediate attachment perimeter disposed between the first and second surfaces of the second ring;
wherein:
the first flexible diaphragm, the intermediate flexible diaphragm, and the first and second rings form a first chamber with one or more intake apertures; and the second flexible diaphragm, the intermediate flexible diaphragm, and the first and second rings form a second chamber with one or more intake apertures.

13. The mounting apparatus of claim 12 wherein one or more of the first effective surface area, the intermediate effective surface area, or the second effective surface area are not identical.

14. The mounting apparatus of claim 13 wherein the intermediate effective surface area is greater than the first effective surface area.

15. The mounting apparatus of claim 13 wherein the intermediate effective surface area is less than the first effective surface area.

16. The mounting apparatus of claim 12 wherein one or more of the first, intermediate, and second flexible diaphragms comprise thin foils of metal.

17. The mounting apparatus of claim 16 wherein the metal comprises one or more of beryllium-copper alloy, brass, bronze, stainless steel, titanium, titanium alloy, nickel alloy, or nitinol.

18. The mounting apparatus of claim 12 wherein one or more of the first, intermediate, and second flexible diaphragms comprise one or more concentric rings.

19. The mounting apparatus of claim 12 wherein one or more of the first, intermediate, and second flexible diaphragms comprise one or more spiral grooves.

20. The mounting apparatus of claim 12 wherein one or more of the first, intermediate, and second flexible diaphragms are thin sheets of elastic material comprised of one or more of polyimide, polyamide, silicone, rubber, polyurethane, or urethane.

21. The mounting apparatus of claim 12 wherein one or more of the first, intermediate, and second rings are rigid.

* * * * *